United States Patent [19]

Morgan

[11] Patent Number: 5,787,042
[45] Date of Patent: Jul. 28, 1998

[54] METHOD AND APPARATUS FOR READING OUT A PROGRAMMABLE RESISTOR MEMORY

[75] Inventor: Donald M. Morgan, Boise, Id.

[73] Assignee: Micron Technology, Inc., Boise, Id.

[21] Appl. No.: 819,991

[22] Filed: Mar. 18, 1997

[51] Int. Cl.[6] .................... G11C 7/00; G01R 19/00
[52] U.S. Cl. .................. 365/196; 365/100; 365/148;
365/210; 365/205; 365/189.05; 365/163;
327/55; 327/56; 327/57
[58] Field of Search ...................... 365/196, 100,
365/148, 210, 205, 189.05, 163; 327/54,
55, 56, 57

[56] References Cited

U.S. PATENT DOCUMENTS

| | | | |
|---|---|---|---|
| 3,721,838 | 3/1973 | Brickman et al. | 327/427 |
| 3,820,087 | 6/1974 | Chaudhari et al. | 365/113 |
| 3,820,150 | 6/1974 | Nicolaides | 257/4 |
| 3,846,767 | 11/1974 | Cohen | 327/198 |
| 3,875,566 | 4/1975 | Helbers | 365/163 |
| 3,877,049 | 4/1975 | Buckley | 257/4 |
| 3,918,032 | 11/1975 | Nicolaides | 257/3 |
| 3,979,586 | 9/1976 | Thornburg | 250/208.1 |
| 4,115,872 | 9/1978 | Bluhm | 365/163 |
| 4,180,866 | 12/1979 | Shanks | 365/186 |
| 4,199,692 | 4/1980 | Neale | 365/163 |
| 4,203,123 | 5/1980 | Shanks | 257/2 |
| 4,420,766 | 12/1983 | Kasten | 365/103 |
| 4,795,657 | 1/1989 | Formigoni et al. | 427/96 |
| 4,845,533 | 7/1989 | Pryor et al. | 257/4 |
| 4,876,668 | 10/1989 | Thakoor et al. | 365/163 |
| 5,177,567 | 1/1993 | Klersy et al. | 257/4 |
| 5,285,083 | 2/1994 | Pulfrey et al. | 257/52 |
| 5,315,131 | 5/1994 | Kishimoto et al. | 257/57 |
| 5,341,328 | 8/1994 | Ovshinsky et al. | 365/163 |
| 5,360,981 | 11/1994 | Owen et al. | 257/4 |
| 5,363,329 | 11/1994 | Troyan | 365/184 |
| 5,414,271 | 5/1995 | Ovshinsky et al. | 257/3 |
| 5,457,649 | 10/1995 | Eichman et al. | 365/174 |
| 5,481,128 | 1/1996 | Hong | 257/320 |
| 5,488,584 | 1/1996 | Vo et al. | 365/203 |
| 5,523,970 | 6/1996 | Riggio, Jr. | 365/185.01 |
| 5,534,711 | 7/1996 | Ovshinsky et al. | 257/3 |
| 5,534,712 | 7/1996 | Ovshinsky et al. | 257/3 |
| 5,536,947 | 7/1996 | Klersy et al. | 257/3 |
| 5,541,130 | 7/1996 | Ogura et al. | 438/257 |

*Primary Examiner*—David C. Nelms
*Assistant Examiner*—Andrew Q. Tran
*Attorney, Agent, or Firm*—Dickstein Shapiro Morin & Oshinsky, LLP

[57] ABSTRACT

To read out a data bit stored in a memory cell including a programmable resistor memory element, a first voltage is developed on a first sense node due to initiation of current flow through the memory element and a second voltage is developed on a second sense node due to current flow through a reference resistor. The first and second voltages are separately detected to generate a trip signal in response to a leading edge of either of the first and second voltages achieving a threshold level. A flip-flop circuit is conditioned by the trip signal to produce opposite logic signal voltages on the first and second sense nodes indicative of the binary value of the stored data bit.

20 Claims, 5 Drawing Sheets

METHOD AND APPARATUS FOR READING OUT A PROGRAMMABLE RESISTOR MEMORY

This invention was made with Government support under Contract No. MDA972-92-C-0054 awarded by Advanced Research Projects Agency (ARPA). The Government has certain rights in this invention.

The present invention relates to the comparison circuitry in a memory device. In particular, the invention is directed to an automatic firing circuit to read a memory cell 3and automatic protecting circuit to connect and isolate the comparison circuitry from an array of programmable memory cells.

BACKGROUND OF THE INVENTION

DRAM integrated circuit arrays have existed for more than twenty five years and have evolved from the earliest one kilobit (Kb) generation to the recent 256 megabit (Mb) generation. This dramatic increase in storage capacity has been achieved through advances in semiconductor fabrication technology and circuit design technology. The tremendous advances in these two technologies have also achieved higher and higher levels of integration that permit dramatic reductions in memory array size and cost, as well as increased process yield.

A DRAM memory cell typically comprises, as basic components, an access transistor (switch) and a capacitor for storing a binary data bit in the form of a charge. Typically, a charge of one polarity is stored on the capacitor to represent a binary "1", and a stored charge of the opposite polarity represents a binary "0". The basic drawback of a DRAM is that the charge on the capacitor eventually leaks away, and therefore provisions must be made to "refresh" the capacitor charge or else the data bit stored by the memory cell is lost.

The memory cell of a conventional SRAM, on the other hand, comprises, as basic components, an access transistor or transistors and a memory element in the form of two or more integrated circuit devices interconnected to function as a bistable latch. An example of a bistable latch is cross-coupled inverters. Bistable latches do not need to be "refreshed", as in the case of DRAM memory cells, and will reliably store a data bit indefinitely as long as they continue to receive supply voltage.

Efforts continue to identify other forms of memory elements for use in SRAMs. Recent studies have focused on resistive materials that can be programmed to exhibit either high or low stable ohmic states. A programmable resistance element of such material could be programmed (set) to a high resistive state to store, for example, a binary "1" data bit or programmed to a low resistive state to store, for example, a binary "0" data bit. The stored data bit could then be retrieved by detecting either the magnitude of a voltage drop over or the magnitude of a current flowing through the resistive memory element by readout circuitry, thus indicating its stable resistance state.

One particularly promising programmable, bistable resistive material is chalcogenide, such as, for example, the alloy Ge:Sb:Te disclosed in Ovshinsky et al., U.S. Pat. No. 5,414,271, the disclosure of which is incorporated herein by reference. A memory element comprised of a chalcogenide material can be programmed to a stable high resistive state by passing a narrow, high amplitude current pulse through it. A lower amplitude current pulse of longer duration programs a chalcogenide memory element to a stable, low resistive state. Additionally, the appropriate current pulse reprograms the chalcogenide memory element, relieving the need to first erase the memory cell. Moreover, a memory element of chalcogenide material is nonvolatile, in that it retains its programmed resistive state regardless of whether it is connected to a power supply.

Research and development efforts are now being directed toward providing circuitry for writing and reading data to/from an array of chalcogenide resistance elements. However, serious problems have been encountered. For example, use of low voltage on the order of, for example, 100 mV to 200 mV to read chalcogenide resistance elements will not disrupt the programmed state of the chalcogenide resistance element, but it is insufficient to drive the next stage comparison circuits. Use of high voltage to read data from chalcogenide resistance elements can reprogram the elements and corrupt the data stored therein. Present readout circuitry, such as comparison circuits, therefore, incorporate time delays to allow sufficient time for the comparison circuit to sense or read out the resistive state of the memory element using low voltage and then isolate the memory element prior to driving the comparator with high voltage. Unfortunately, due to operating temperature, manufacturing tolerance, etc., the time required to reliably sense the memory element varies for each batch manufactured. Accordingly, an artificially long time delay must be incorporated into the operation of the readout circuitry to accommodate the worst case scenario (slowest response time) before action is taken to isolate the comparators from the memory elements and then apply the high drive voltages necessary to latch the comparators in a state indicative of the data bit read out from the memory element. Consequently, in most cases, memory read out time is unduly lengthened.

SUMMARY OF THE INVENTION

Advantages achieved by the invention will be set forth in part in the description which follows, and in part will be obvious from the description, or may be learned by practice of the invention. The advantages of the invention will be realized and attained by means of the elements and combinations particularly pointed out in the appended claims.

To attain the advantages and in accordance with the purposes of the invention, as embodied and broadly described herein, there is provided in accordance with one aspect of the present invention circuitry for reading out a data bit stored in a memory cell of a memory array, comprising a readout circuit including at least one sense node coupled to receive a readout signal from the memory cell; and a detector circuit coupled to the sense node and operating when the readout signal achieves a threshold level indicative of the data bit stored in the memory cell to condition the readout circuit such that the sense node is driven to a logic signal level that reliably indicates a binary value of the stored data bit.

The advantages and purposes of the present invention are also achieved in accordance with another aspect of the present invention by a method of reading out a data bit stored by a programmable resistor memory element, comprising the steps of coupling a first sense node to receive a readout signal from the memory element during a readout cycle; coupling a second sense node to receive a reference signal; detecting the readout signal developing on the first sense node; detecting the reference signal developing on the second sense node; generating a trigger signal when one of the developing readout and reference signals achieves a threshold; and driving the first and second sense nodes, in response to the trigger signal, to opposite logic signal levels indicative of a binary value of the stored data bit.

BRIEF DESCRIPTION OF THE DRAWINGS

Like reference numerals refer to corresponding parts throughout the several figures of the drawings.

DESCRIPTION OF THE PREFERRED EMBODIMENT

Reference will now be made in detail to the present preferred embodiments of the invention, examples of which are illustrated in the accompanying drawings. It is intended that all matter contained in the description below or shown in the accompanying drawings shall be interpreted as illustrative and not in a limiting sense.

A problem indigenous to existing chalcogenide resistance element memories is that the readout (comparison) circuitry requires high voltages to drive comparators to states capable of reliably outputting to other computer components data bits stored in the memory. These high voltages are capable of spuriously reprogramming the memory elements, causing data corruption. In order to avoid this problem, existing technology has imposed artificially long time delays in the read out cycles. This artificial time delay provides a safety margin to accommodate variations in readout circuitry characteristics. Two such safety margins effecting circuit response time are manufacturing imperfections and operating conditions. Circuit response time depends on tolerances in the manufacturing process which cause imperfections in batches of manufactured circuits. In other words, two batches of readout circuits will normally require different times to sense the resistive state of a memory element. Based upon the imperfections, or lack thereof, the readout circuitry would be classified as slow or fast. Response time is also influenced by whether the operating conditions of the circuit are optimal or suboptimal. Thus, when building the artificial time delay into a readout cycle, the manufacturer must include a sufficient time delay to ensure that the slowest batch of integrated circuits, operating under the worst (most suboptimal) conditions, will sensed the resistive state of the memory element prior to supplying high voltages to drive the comparator into a state accurately registering the binary value of the stored data bit.

The present invention overcomes this problem by monitoring the comparator to detect when it receives a readout signal from the memory cell of sufficient magnitude to reliably indicate that it has read out the resistive state of the memory element, which is, indicative of the binary value of the stored data bit. At that moment, the readout circuitry isolates the comparator from the memory cell to prevent reprogramming the memory cell as the high voltage is applied to the comparator. Thus, the readout cycle time is tailored to each comparison circuit, regardless of the manufacturing tolerance or operating conditions.

Figure 1:
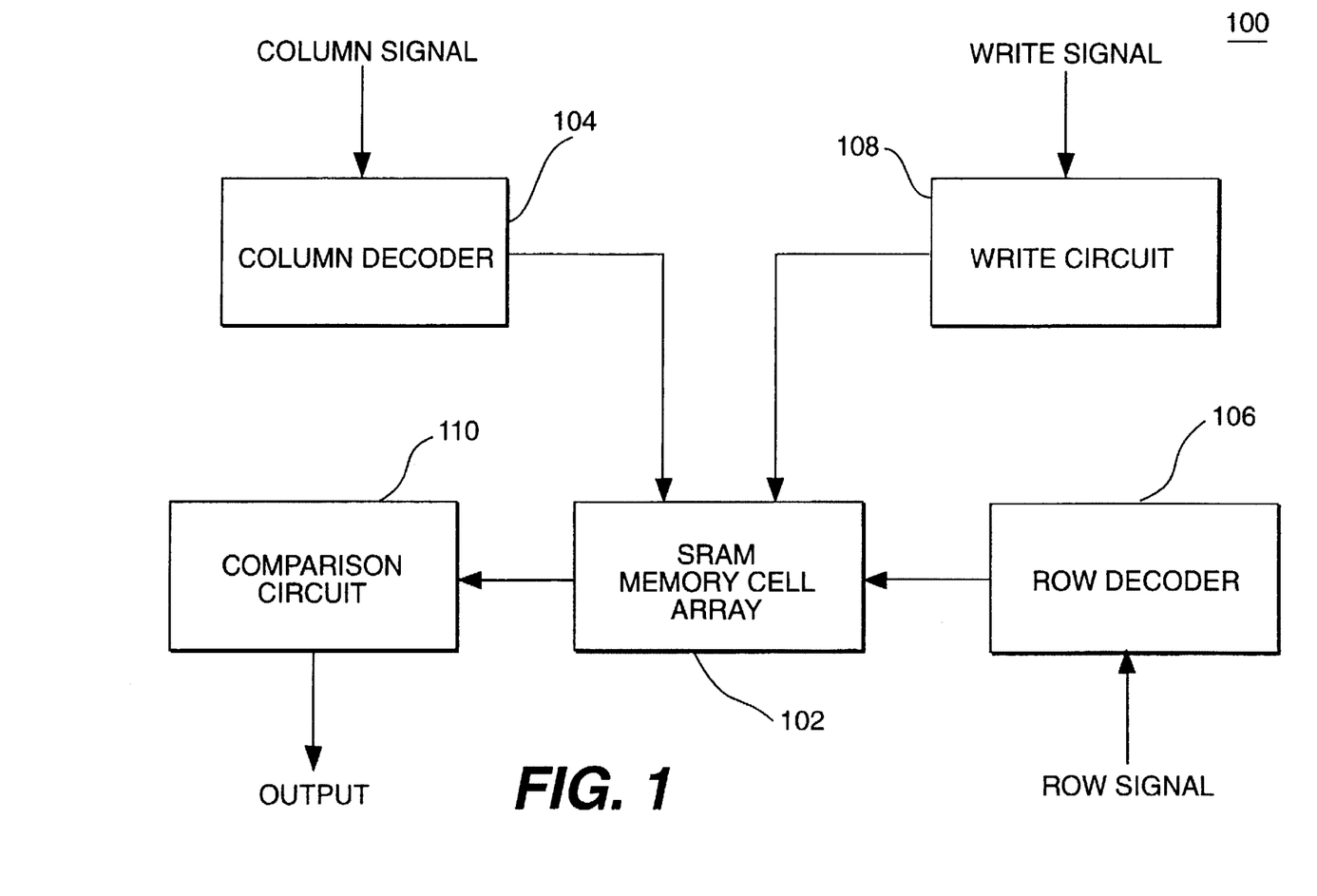
FIG. 1 is a functional block diagram of typical read/write circuitry serving a SRAM memory cell array of resistive memory elements.

FIG. 1 illustrates a memory system 100 separated into basic functional blocks. A programmable memory 102 contains an array of memory cells, each including a resistor formed of a material, such as, for example, chalcogenide, whose resistive state can be programmed to either a high or low ohmic value by subjection to electrical impulses. A column decoder 104 receives a column address signal for selecting a particular column of memory 102, and row decoder 106 receives a row address signal for selecting a particular row. A data bit can then be written into or read from the addressed memory cell located at the intersection of the selected row and column.

Write circuit 108 operates to program individual memory cells in memory 102. Specifically, write circuit 108 receives a write data signal to program the memory cell addressed by the column and row decoders. Write circuit 108 then drives an appropriate constant current through the resistive element of the addressed memory cell, causing it to exhibit either a stable high resistance state indicating storage of, for example, a binary "1", or a stable low resistance state indicating storage of, for example, a binary "0".

Once write circuit 108 programs the memory cell to a binary "1" or binary "0", it is the function of a comparison circuit 110 to read out the stored binary data bit. In general, comparison circuit 110 operates to supply a regulated current to a both a reference resistor (not shown) and an addressed memory cell in memory 102. Based upon whether the voltage drop across the memory cell is higher or lower than the voltage drop across the reference resistor, comparison circuit 110 outputs a binary "1" or a binary "0" logic signal indicative of the data bit stored in the memory cell.

An example of a resistance memory system of the character generally described above is described more completely in U.S. patent application Ser. No. 08/704.953 of Donald M. Morgan ("Morgan"), filed Aug. 26, 1996, and entitled "Memory and Apparatus for Reading/Writing Data In a Memory System including Programmable Resistors", which disclosure is expressly incorporated herein by reference. In the memory system disclosed in Morgan, the comparison circuits contain an isolation circuit, a helper flip-flop (comparator), and a precharge circuit. These components function together to compare a reference resistance to the programmed resistance of a memory cell. Based upon the comparison results, the comparison circuit produces a logic signal output indicating whether the memory cell is storing a binary "1" or a binary "0".

Figure 2:
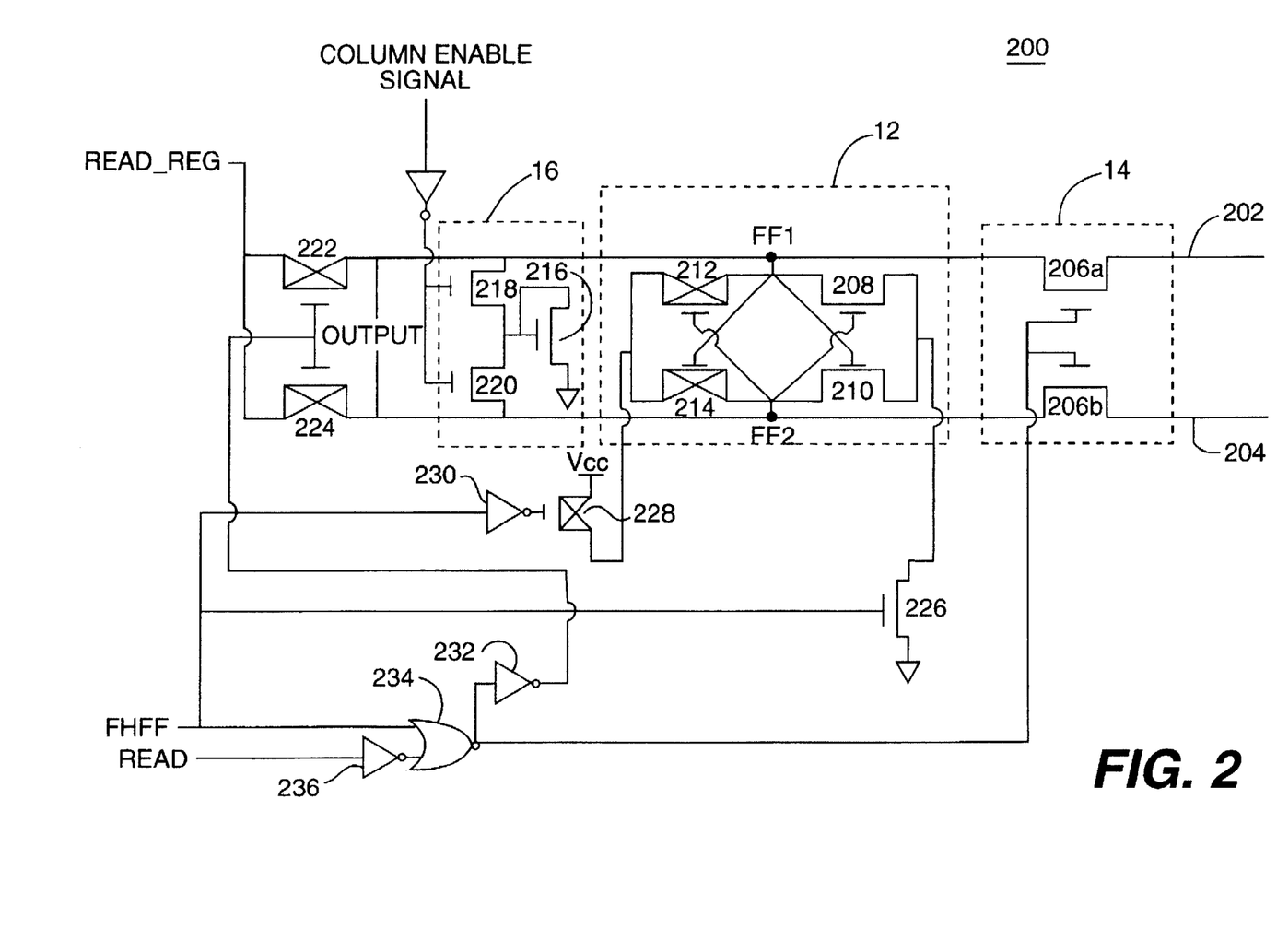
FIG. 2 is a schematic diagram of circuitry that has been proposed for reading data bits stored in the SRAM memory cell array of FIG. 1.

FIG. 2 illustrates a comparison circuit according to the disclosure in Morgan. Basically, comparison circuit 200 compares the voltage drop across a reference resistor (not shown) connected to an input line 202 to a voltage drop across a memory cell (not shown) connected to input line 204. These input lines are separately connected through isolation transistors 206a and 206b of an isolation circuit 14 to a helper flip-flop 12 (comparator). Helper flip-flop 12 includes two CMOS inverters, i.e., an n-channel MOS transistor 208 and a p-channel MOS transistor 212, cross-coupled to an n-channel MOS transistor 210 and a p-channel MOS transistor 214. These inverters are connected to sense nodes FF1 and FF2 of helper flip-flop 12, to which input lines 202 and 204 are respectively connected during a readout cycle.

Initially, a COLUMN ENABLE signal is low, signifying that comparison circuit 200 is disconnected from the memory cell array and sense nodes FF1 and FF2 are shorted together to equalize their potentials at a low precharge level, as described in Morgan. Fire helper flip-flop (FHFF) signal is also low at this time, which maintains transistor 226 off, thus disconnecting the sources of transistors 208 and 210 from ground. Moreover, the low FHFF signal turns transistor 228 off via inverter 230, thereby disconnecting the sources of transistors 212 and 214 from source voltage Vcc.

At this point, a READ signal is preferably low, which, when inverted by inverter 236 and NORed with the low FHFF signal, isolates input lines 202 and 204 from nodes FF1 and FF2, respectively, by turning off isolation transistors 206a and 206b via inverter 236 and NOR gate 234. Also, a READ_REG signal is isolated from helper flip-flop 12 by the off state of transistors 222 and 224 imposed by the output of NOR gate 234, as applied through inverter 232.

To perform a read function, COLUMN ENABLE goes high to turn off transistors 218 and 220, such that sense nodes FF1 and FF2 are no longer shorted together. Additionally, the READ signal goes high, which, when NORed with the low FHFF signal, causes the output of NOR gate 234 to go high. The high NOR gate 234 output turns an isolation transistors 206a and 206b, connecting input lines 202 and 204 to helper flip-flop 12. Additionally, the high output from NOR gate 234 turns on transistors 222 and 224, supplying READ_REG voltage to nodes FF1 and FF2. Thus, a readout current flows through input line 204 and the programed resistive element of the addressed memory cell. Concurrently, a reference current flows through input line 202 and the connected reference resistor. The nodes FF1 and FF2 then assume potentials as determined by the voltage drops developed across the reference resistor and the programmed resistive element of the addressed memory cell preparatory to setting a latched state of helper flip-flop 12. The relationship of the FF2 node potential to the FF1 node potential is indicative of whether the addressed memory cell resistance has been programmed to a high resistance, e.g., a binary "1", or a low resistance, e.g., a binary "0".

After an appropriate artificial time delay, i.e., sufficient to ensure that the slowest readout circuitry operating in the most suboptimal conditions has reliably sensed the resistive state of the addressed memory cell of memory 102, FHFF signal goes high and, when NORed with the inverted READ signal, which is a low signal, turns off isolation transistors 206a and 206b via NOR gate 234. Input lines 202 and 204 are then isolated from nodes FF1 and FF2, and transistors 222 and 224 are turned off via NOR gate 234 and inverter 232 to remove READ_REG from nodes FF1 and FF2. Concurrently, FHFF turns on transistors 226 and 228 to connect the sources of transistors 208 and 212 to ground and the sources of transistors 210 and 214 to Vcc, thereby "firing" helper flip-flop 12. Depending upon the relationship of the FF1 and FF2 node potentials, one of the nodes FF1, FF2 is driven to Vcc and the other of the nodes FF1, FF2 is driven to ground as helper flip-flop 12 is "fired". The latched logic level potentials Vcc and ground on nodes FF1 and FF2 are read out through gating circuitry shown in Morgan to indicate whether a binary "1" or a binary "0" has been read from the addressed memory cell.

Comparison circuit 200 reliably reads data stored in a programmable resistor memory; however, an artificial time delay is necessary to ensure that the potentials on sense nodes FF1 and FF2 have achieve levels reliably indicative of the resistive state of the addressed memory cell of memory 102 before helper flip-flop 12 is isolated from the memory cell and fired. In accordance with the present invention, comparison circuit 300, seen in FIG. 3, overcomes this drawback of comparison circuit 200, in FIG. 2, by eliminating the need for an artificial long time delay that, in most cases, is unnecessary. To achieve this end, comparison circuit 300 includes a detector 24 that operates to generate a trip signal. The trip signal indicates that helper flip-flop 12 has reliably read out the resistive state of the memory cell and initiates firing of helper flip-flop 12. Thus, this trip signal advantageously serves the purpose of the FHFF signal in comparison circuit 200, of FIG. 2, but without the artificial time delay.

Figure 3:
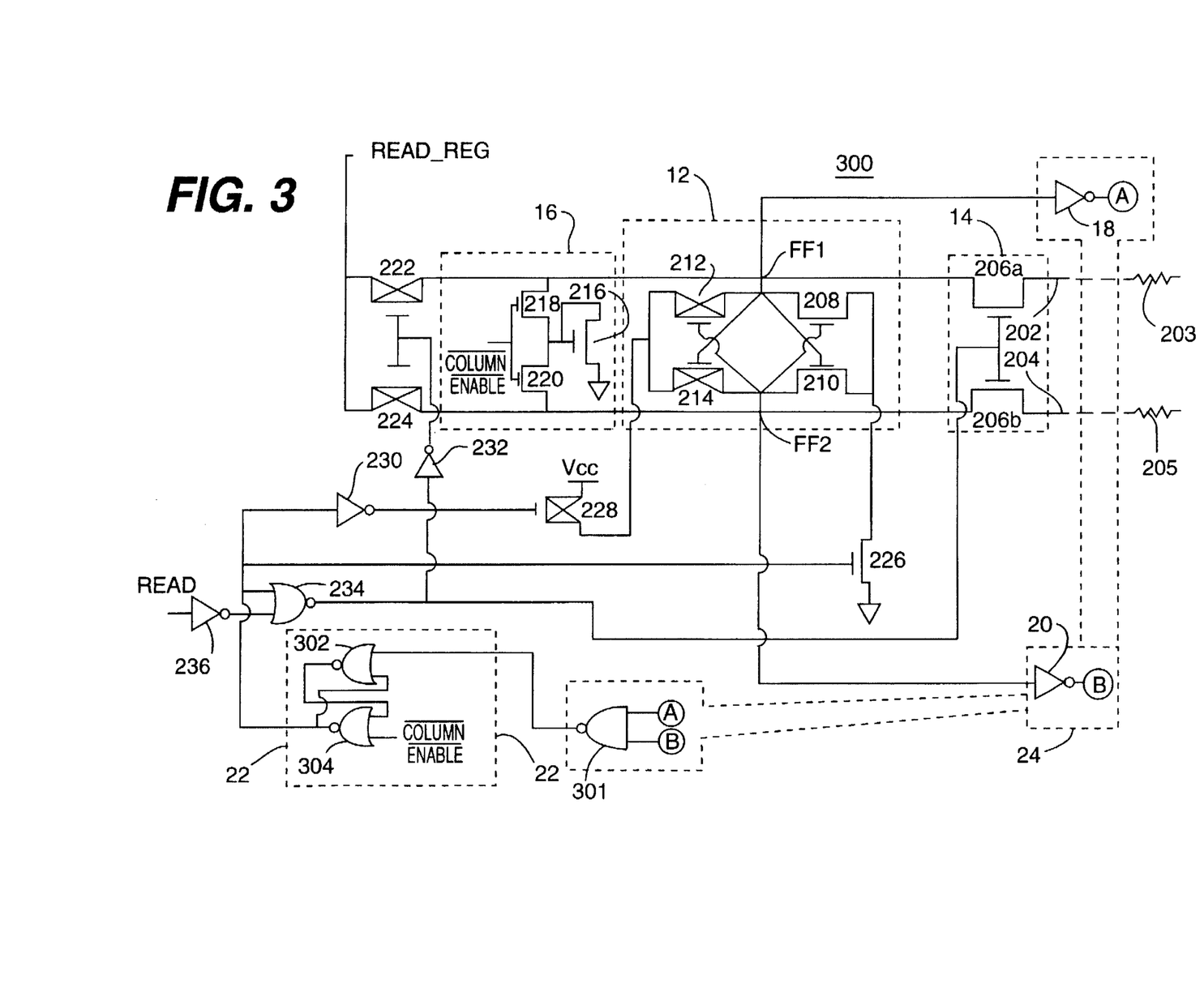
FIG. 3 is a schematic diagram of readout circuitry in accordance with a preferred embodiment of the present invention.

As seen in FIG. 3, a detector circuit 24 includes detector circuits 18 and 20, and a NAND gate 301. A trip signal issued by either one of detectors 18 or 20 passes through NAND gate 301 to set a latch 22 consisting of cross-connected NOR gates 302 and 304. The set output appearing at the output of NOR gate 304 then serves as an FHFF trigger signal to fire helper flip-flop 12 in circuit 300 in the same manner as comparison circuit 200 of FIG. 2. The operation of the detectors is explained below.

Each of the detectors 18 and 20 has the same circuitry, and thus only one, detector 18, will be described with reference to FIG. 4. As illustrated, detector 18 includes a string of four transistors connected in series between Vcc and ground. Specifically, the source of a p-channel transistor 18a is connected to Vcc and its drain is connected through the source-drain circuits of p-channel transistors 18b and 18c and n-channel transistor 18d to ground. The gates of transistors 18c and 18d are connected in common to helper flip-flop node FF1, and a node A between the transistor 18c drain and transistor 18d drain is connected to one input of NAND gate 301 in FIG. 3. A p-channel transistor 18e has its source connected to Vcc, its drain connected to the junction 19 of the transistor 18b drain and transistor 18c source, and its gate connected to receive the COLUMN ENABLE signal. The gate of transistor 18a is connected to junction 19, and the gate of transistor 18b is grounded.

As described above with regard to comparison circuit 200 of FIG. 2, prior to initiation of a readout cycle, the COLUMN ENABLE signal is low, and thus transistor 18e is turned on to apply Vcc to junction 19, which, in turn, maintains transistor 18a off. COLUMN ENABLE is thus high to turn on transistors 218 and 220, which, as seen in FIG. 3, connects nodes FF1 and FF2 to a common, low precharge potential. Under these conditions, transistor 18c is turned on and transistor 18d is turned off, and output node A assumes a high potential approximating Vcc. The same conditions prevail in detector circuit 20, and thus its output node B is also high. The imposition of Vcc on junction 19 by the conduction of transistor 18e at all times other than during a readout cycle ensures that transistor 18c cannot be rendered non-conductive by spurious voltage spikes on node FF1 that would result in a false trigger signal (node A transitions to a low signal level). The same assurance is provided in detector 20 to prevent the generation of a false trigger signal on output node B.

Returning to FIG. 3, since both detector circuit outputs A and B, as applied to NAND gate 301, are high, the output of this gate is low, and, since the COLUMN ENABLE signal is high, the output of NOR gate 304 of latch 22 is low. As a result, the output of NOR gate 302 of latch 22 is high. The low output from NOR gate 304 maintains transistor 228 off, via inverter 230, and also maintains transistor 226 off. Since the READ signal is low, except during a readout cycle, inverter 236 applies a high input to NOR gate 234, whose output goes low to maintain isolation transistors 206a and 206b off. Thus, helper flip-flop 12 is disconnected from Vcc and ground, and nodes FF1 and FF2 are isolated from input lines 202 and 204.

Figure 5A:
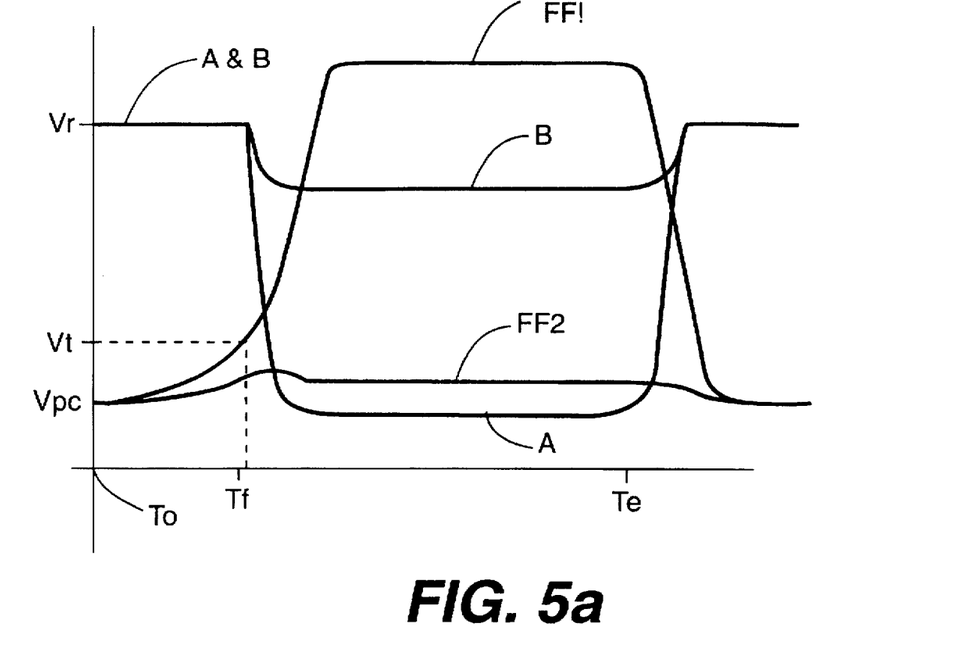
FIG. 5a is a timing diagram illustrating the operation of readout circuitry in FIG. 3 when reading out a binary "1"
Figure 5B:
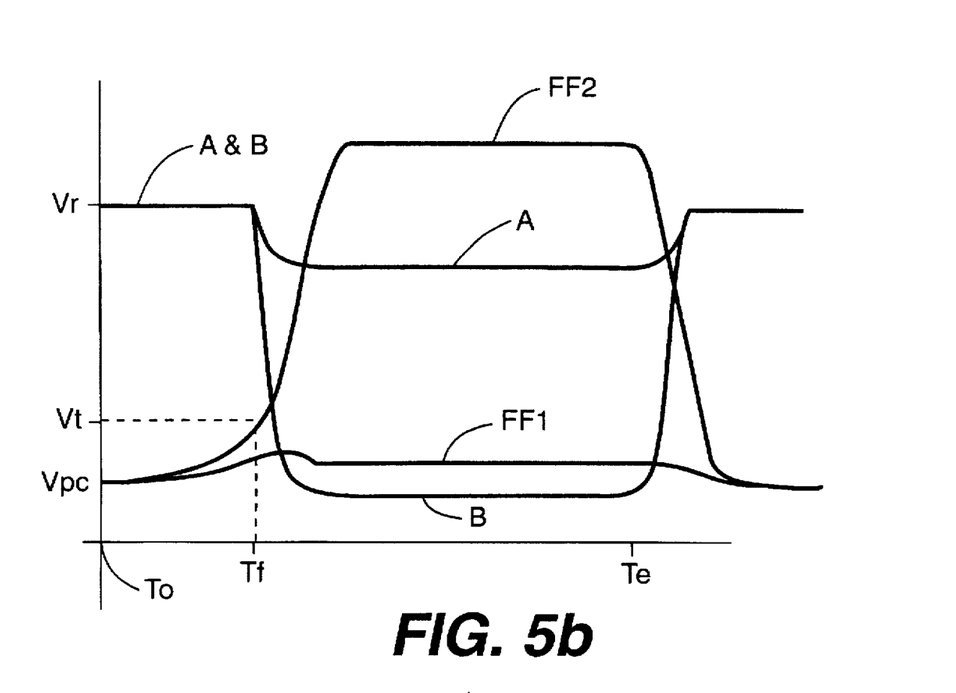
FIG. 5b is a timing diagram illustrating the operation of the readout circuitry of FIG. 3 when reading out a binary "0".

Upon initiation of a readout cycle at time To in FIGS. 5a and 5b, the COLUMN ENABLE and READ signals go high. The $\overline{\text{COLUMN ENABLE}}$ signal goes low. However, since the detector outputs A and B remain high, the output of NOR gate 304 remains low to maintain transistors 226 and 228 off. Thus, helper flip-flop 12 remains disconnected from Vcc and ground. Since the two inputs to NOR gate 234, i.e., the READ signal inverted by inverter 236 and the output of NOR gate 304, are low, the output of NOR gate 234 goes high at To to turn on transistors 222 and 224 via inverter 232, as well as isolation transistors 206a and 206b. The low $\overline{\text{COLUMN ENABLE}}$ signal turns off transistors 218 and 220, such that the READ_REG current applied through transistors 222 and 224, begins charging nodes FF1 and FF2 in accordance with the currents respectively flowing through a reference resistor 203 connected to input line 202 and through the resistor element 205 of the addressed memory cell connected to input line 204 (FIG. 3).

Figure 4:
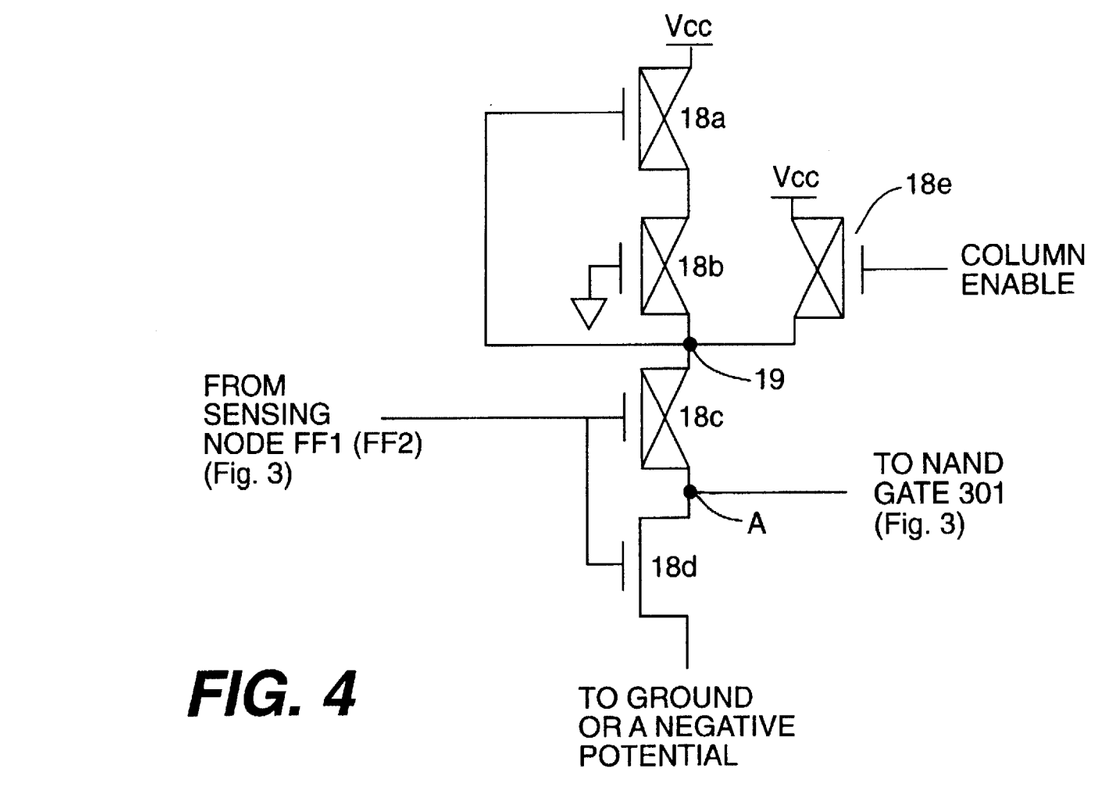
FIG. 4 is a detailed schematic diagram of one of a pair of detectors included in the readout circuitry of FIG. 3.

Also, the transition of the COLUMN ENABLE from high to low at time To turns off transistor 18e in detector 18, as seen in FIG. 4. As a consequence, transistors 18a and 18b turn on, and node 19 assumes a reference voltage that is less than Vcc by the voltage drops of the source-drain circuits of transistors 18a and 18b. The same action occurs in detector 20, and thus its node 19 also assumes a corresponding reference voltage at To at the beginning of a readout cycle.

As seen in FIGS. 5a and 5b, as a readout cycle progresses from To, output nodes A and B of detectors 18 and 20 are high, i.e., approximately equal to the reference voltage Vr on nodes 19. Also at time To, currents begin flowing through the reference resistor 203 and the resistor element 205 of the addressed memory cell, and the voltages on nodes FF1 and FF2, respectively, begin rising from their precharge levels Vpc. The rate at which the FF2 node potential rises depends upon whether the resistive element of the addressed cell has been programmed to a high ohmic state or a low ohmic state. By appropriately selecting the resistive value of the reference resister to be a value approximately half-way between the resistance values of the resistive memory elements in the high and low ohmic states, a relationship can be achieved wherein the node FF1 voltage rises more rapidly than the node FF2 voltage when the resistive memory element is programmed to a high ohmic state and less rapidly than the node FF2 voltage when the resistive memory element is programmed to a low ohmic state.

FIG. 5a illustrates the case where the resistive memory element is programmed to its high ohmic state, and thus, the node FF1 voltage applied to detector 18 is the first to achieve a trip voltage Vt at time Tf. This trip voltage is the gate voltage required to turn transistor 18c off and turn on transistor 18d of detector 18, given the reference voltage on node 19. This action is seen in FIG. 4 to pull the high voltage Vr on node A down to a low voltage, e.g, ground or an appropriate negative voltage. This high to low voltage transition on node A is a trigger signal issued by detector 18.

FIG. 5b illustrates the case where the resistive memory element of the address memory cell is programmed to a low ohmic state. Thus, the node FF2 voltage is the first to reach the trip voltage, and detector 20, identical to detector 18 and connected to serial node FF2, generates a trip signal (high to low voltage transition) on its output node B.

As can be seen in FIG. 3, a trip signal generated by either detector 18 or detector 20 switches the output of NAND gate 301 from low to high and the output of NOR gate 304 from low to high. As a result, the output of NOR gate 234 goes low to render isolation transistors 206a and 206b nonconductive, thus isolating input lines 202 and 204 (and their connected reference resistor and resistive memory element) from helper flip-flop 12. The low NOR gate 234 also turns off transistors 222 and 224 to remove the READ_REG current from nodes FF1 and FF2. Concurrently, the high output of NOR gate 304 (the latched trip signal from either detector 18 or detector 20) also turns on transistor 228, via inverter 230, and transistor 226, thereby connecting helper flip-flop 12 across Vcc and ground. The helper flip-flop is thus fired to latch nodes FF1 and FF2 at the high and low logic voltage levels, seen in FIGS. 5a and 5b, appropriate to represent the binary value of the stored data bit read in the addressed memory cell.

The end of a read cycle is marked by a transition of the COLUMN ENABLE signal from high to low and the transition of its complement $\overline{\text{COLUMN ENABLE}}$ signal from low to high at Te in FIGS. 5a and 5b. As seen in FIG. 3, trip signal latch 22 is reset by the $\overline{\text{COLUMN ENABLE}}$ signal, such that the output of NOR gate 304 goes low. As a result, helper flip-flop 12 is disconnected from VCC (transistor 228 turned off) and ground (transistor 226 turned off). The high $\overline{\text{COLUMN ENABLE}}$ signal also turns on transistors 218 and 220, causing nodes FF1 and FF2 to be pulled down to pre-charge potential Vpc, as seen in FIGS. 5a and 5b. Concurrently, the low COLUMN ENABLE signal applied to the detector circuits 18 and 20 (FIG. 4) forces their output nodes A and B back to the reference voltage Vr, as also seen in FIGS. 5a and 5b. Comparison circuit 300 is thus ready to execute the next readout cycle.

From the foregoing description, it is seen that, by virtue of detectors 18 and 20, the FF1 and FF2 node voltages are detected on the rise, i.e., their leading edges, to determine whether the data bit stored in a resistive memory element is a "1" or a "0", and the helper flip-flop 12 is fired immediately upon detecting a definitive difference in FF1 and FF2 node voltages. While the time required for one or the other of the FF1 and FF2 node voltages to achieve the trip voltage Vt may vary from memory cell to memory cell and array to array, the present invention does not require the artificial delay imposed on the FHFF signal in the comparison circuit 200 of FIG. 2. Thus, comparison 300 advantageously accommodates a shorter readout cycle that is uniquely tailored to the readout response time inherent to each resistive memory cell in the array.

It will be apparent to those skilled in the art that various modifications and variations can be made in the method of the present invention and in construction of the preferred embodiments without departing from the scope or spirit of the invention. Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. Circuitry for reading out a data bit stored in a memory cell of a memory array, comprising:

a readout circuit including at least one sense node coupled to receive a readout signal from the memory cell; and a detector circuit coupled to the sense node and operating when the readout signal achieves a threshold level indicative of the data bit stored in the memory cell to condition the readout circuit such that the sense node is driven to a logic signal level that reliably indicates a binary value of the stored data bit.

2. The circuitry defined in claim 1, wherein the detector circuit operates to condition the readout circuit when a leading edge of the readout signal achieves the threshold level.

3. The circuitry defined in claim 2, wherein the memory cell includes a programmable resistor memory element.

4. The circuitry defined in claim 2, wherein:
the readout circuit includes a first sense node coupled to receive the readout signal and a second sense node coupled to receive a reference signal, and
the detector circuit includes a first detector coupled to the first sense node and a second detector coupled to the second sense node, the readout circuit being conditioned to drive the first and second sense nodes to opposite logic signal levels indicative of the binary value of the stored data bit by one of the first and second detectors depending upon which of leading edges of the readout and reference signals first achieves respective threshold levels.

5. A circuit for reading out a data bit stored in a programmable resistor memory element of a memory array, comprising:
a comparator including a first sense node coupled to receive a readout signal from the memory element and a second sense node coupled to receive a reference signal; and
a detector circuit coupled to the first and second sense nodes and operating when a leading edge of one of the readout and reference signals first achieves a threshold level to generate a trip signal, the comparator, in response to the trip signal, operating to drive the first sense and second sense nodes to opposite logic signal levels depending on an amplitude relationship of the readout and reference signals at the time of trip signal generation, the sense node logic signal levels being indicative of a binary value of the stored data bit.

6. The circuit defined in claim 5, wherein one of the logic signal levels is of a high voltage relative to a voltage of the threshold level, the circuit further including an isolation circuit for disconnecting at least the memory element from the first sense node in response to the trip signal.

7. The circuit defined in claim 6, wherein the comparator comprises a flip-flop that is set to either of two stable states by the trip signal.

8. The circuit defined in claim 6, wherein the detector circuit includes:
a first detector having an input coupled to the first sense node and an output on which the trip signal is generated when the readout signal leading edge is the first to achieve the threshold level;
a second detector having an input coupled to the second sense node and an output on which the trip signal is generated when the reference signal is the first to achieve the threshold level; and
a gate having inputs connected to the outputs of the first and second detectors and an output on which the trip signal from either the first detector or the second detector appears.

9. The circuit defined in claim 8, further including a latch connected to be set by the trip signal on the gate output, whereby to produce a latched trip signal to the comparator and the isolation circuit, the latch being reset by a timing signal concluding a readout cycle.

10. The circuit defined in claim 8, wherein each of the first and second detectors includes an inverter and a threshold adjusting circuit, the inverter coupled to one of the first and second sense nodes and having an output that undergoes a voltage level transition to generate the trip signal when the leading edge of one of the readout and reference signals achieves the threshold level set by the threshold adjusting circuit.

11. The circuit defined in claim 10, wherein the threshold adjusting circuit is controlled by a readout cycle timing signal to set a first threshold level effective to inhibit trip signal generation during intervals between readout cycles and to set a second threshold level achievable by the leading edges of the readout and reference signals during a readout cycle.

12. The circuit defined in claim 11, wherein the threshold adjusting circuit includes:
first and second MOS transistors having source-drain circuits connected in series between a supply voltage node and a threshold level voltage node, a gate of one of the first and second MOS transistors connected to the threshold level voltage node,
a third MOS transistor having a source-drain circuit connected between the supply voltage node and the threshold level voltage node and a gate for receiving the readout cycle timing signal, such that the third MOS transistor is rendered conductive by the timing signal to set the first threshold level on the voltage node during intervals between readout cycles, the first threshold level rendering the one of the first and second MOS transistors non-conductive, the timing signal rendering the third MOS transistor non-conductive during the readout cycle, such that the first and second MOS transistors are rendered conductive to set the second threshold level on the threshold level voltage node.

13. The circuit defined in claim 12, wherein the first, second, and third MOS transistors are p-channel MOS transistors.

14. The circuit defined in claim 13, wherein the inverter includes a fourth MOS transistor and a fifth MOS transistor having source-drain circuits connected between there threshold level voltage node and a low reference voltage node, gates of the fourth and fifth MOS transistors commonly connected to the one of the first and second sense nodes, and a node between the source-drain circuits of the fourth and fifth MOS transistors serving as the inverter output.

15. The circuit defined in claim 14, wherein the fourth MOS transistor is a p-channel MOS transistor and the fifth MOS transistor is an n-channel MOS transistor.

16. A method of reading out a data bit stored in a memory cell of a memory array, comprising:
initiating a readout signal from the memory cell during a readout cycle;
detecting a leading edge of the readout signal;
generating a trigger signal when the leading edge of the readout signal achieves a threshold level; and
conditioning a readout circuit, in response to the trigger signal, to produce a logic signal indicative of a binary value of the stored data bit.

17. A method of reading out a data bit stored by a programmable resistor memory element, comprising:
coupling a first sense node to receive a readout signal from the memory element during a readout cycle;
coupling a second sense node to receive a reference signal;
detecting the readout signal developing on the first sense node;

detecting the reference signal developing on the second sense node;

generating a trigger signal when one of the developing readout and reference signals achieves a threshold; and driving the first and second sense nodes, in response to the trigger signal, to opposite logic signal levels indicative of a binary value of the stored data bit.

18. The method defined in claim 17, further including the step of isolating the memory element from the first sense node in response to the trigger signal.

19. The method defined in claim 18, further comprising the steps of:

applying a regulated current to the first and second sense nodes at the beginning of the readout cycle to produce a current flow through the memory element as the readout signal and to produce a current flow through a reference resistor as the reference signal.

20. The method defined in claim 18, further including the steps of:

adjusting the threshold to a first value effective to inhibit generation of the trigger signal during intervals between readout cycles; and adjusting the threshold to a second value achievable by leading edges of the readout and reference signals, and thereby effective to initiate generation of the trigger signal during readout cycles.

\* \* \* \* \*

UNITED STATES PATENT AND TRADEMARK OFFICE
CERTIFICATE OF CORRECTION

PATENT NO. : 5,787,042

DATED : 7/28/98

INVENTOR(S) : Donald Morgan

It is certified that error appears in the above-identified patent and that said Letters Patent is hereby corrected as shown below:

TITLE PAGE:
In Attorney, Agent, or Firm, change "Oshinsky, LLP" to --Oshinsky LLP--.

In column 1, line 11, change "3and" to --and--.

In column 3, line 58, change "sensed" to --sense--; and
line 66, change "is. indicative" to --is indicative--.

In column 5, line 24, change "an" to --on--.

In column 6, line 4, change "artificial" to --artificially--.

In column 7, line 57, change "e.g" to --e.g.--.

In column 8, line 23, change "VCC" to --Vcc--.

In column 10, line 40, change "there" to --the--.

Signed and Sealed this

Twenty-fourth Day of November,1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.    : 5,787,042
DATED         : July 28, 1998
INVENTOR(S)   : Donald M. Morgan It is certified that error appears in the above-identified patent and that said Letters Patent is hereby corrected as shown below:

<u>Column 1,</u>
Line 8, insert -- GOVERNMENT RIGHTS
This invention was made with United States Government support under contract No. DABT63-97-C-0001 awarded by the Advance Research Projects Agency (ARPA). The United States Government has certain rights in this invention. --

Signed and Sealed this

Twenty-fifth Day of September, 2001

*Attest:*

NICHOLAS P. GODICI
*Attesting Officer*    Acting Director of the United States Patent and Trademark Office